(12) United States Patent
Fogel et al.

(10) Patent No.: US 9,099,664 B2
(45) Date of Patent: Aug. 4, 2015

(54) TRANSFERABLE TRANSPARENT CONDUCTIVE OXIDE

(71) Applicant: INTERNATIONAL BUSINESS MACHINES CORPORATION, Armonk, NY (US)

(72) Inventors: Keith E. Fogel, Hopewell Junction, NY (US); Jeehwan Kim, White Plains, NY (US); Devendra K. Sadana, Pleasantville, NY (US); Tze-bin Song, Los Angeles, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 59 days.

(21) Appl. No.: 14/061,124

(22) Filed: Oct. 23, 2013

(65) Prior Publication Data

US 2015/0083224 A1  Mar. 26, 2015

Related U.S. Application Data

(63) Continuation of application No. 14/032,998, filed on Sep. 20, 2013.

(51) Int. Cl.
*H01L 51/44* (2006.01)
(52) U.S. Cl.
CPC .................................. *H01L 51/442* (2013.01)

(58) Field of Classification Search
CPC ............................................ H01L 51/42–51/56
See application file for complete search history.

(56) References Cited

U.S. PATENT DOCUMENTS

| | | | |
|---|---|---|---|
| 4,988,674 A | 1/1991 | Mir et al. | |
| 6,468,841 B2 | 10/2002 | Muramatsu et al. | |
| 6,690,109 B2 | 2/2004 | Tada | |
| 6,878,643 B2 | 4/2005 | Krulevitch et al. | |
| 6,991,963 B2 | 1/2006 | Krulevitch et al. | |
| 7,030,411 B2 | 4/2006 | Krulevitch et al. | |
| 7,259,106 B2 | 8/2007 | Jain | |
| 7,967,936 B2 | 6/2011 | Agarwal et al. | |
| 2001/0000744 A1* | 5/2001 | Wolk et al. | 430/200 |
| 2007/0251570 A1* | 11/2007 | Eckert et al. | 136/256 |

* cited by examiner

*Primary Examiner* — Daniel Shook
(74) *Attorney, Agent, or Firm* — Tutunjian & Bitetto, P.C.; Louis J Percello

(57) ABSTRACT

A method for fabricating a photovoltaic device includes forming an adhesion layer on a substrate, forming a material layer on the adhesion layer and applying release tape to the material layer. The substrate is removed at a weakest interface between the adhesion layer and the substrate by mechanically pulling the release tape to form a transfer substrate including the adhesion layer, the material layer and the release tape. The transfer substrate is transferred to a target substrate to contact the adhesion layer to the target substrate. The transfer substrate includes a material sensitive to formation processes of the transfer substrate such that exposure to the formation processes of the transfer substrate is avoided by the target substrate.

10 Claims, 3 Drawing Sheets

US 9,099,664 B2

TRANSFERABLE TRANSPARENT CONDUCTIVE OXIDE

RELATED APPLICATION DATA

This application is a Continuation application of co-pending U.S. patent application Ser. No. 14/032,998 filed on Sep. 20, 2013, incorporated herein by reference in its entirety.

BACKGROUND

1. Technical Field

The present invention relates to semiconductor devices, and more particularly to fabrication methods and devices using transfer techniques to transfer layers to a target substrate with minimal damage to existing materials on the target substrate.

2. Description of the Related Art

Semiconductor processing typically relies on heat and particle bombardment to form different layers employed in a device. It is difficult to develop an effective method to fabricate devices on sensitive materials, such as organic materials, that react or degrade as a result of such processes. For example, sputtering deposition damages a target layer on which the sputtered material is formed. Humidity in an atomic layer deposition (ALD) process degrades the properties of existing layers. Chemical deposition processes react with the existing layers. Evaporation processes cause thermal reactions with the surface of the target layer and can cause degraded interface properties. Solution processed transparent conductive oxides (TCOs) require high temperature annealing, which limits the material alternatives that can be employed for the target layers in order to achieve needed conductivity.

SUMMARY

A method for fabricating a photovoltaic device includes forming an adhesion layer on a substrate, forming a material layer on the adhesion layer and applying release tape to the material layer. The substrate is removed at a weakest interface between the adhesion layer and the substrate by mechanically pulling the release tape to form a transfer substrate including the adhesion layer, the material layer and the release tape. The transfer substrate is transferred to a target substrate to contact the adhesion layer to the target substrate. The transfer substrate includes a material sensitive to formation processes of the transfer substrate such that exposure to the formation processes of the transfer substrate is avoided by the target substrate.

Another method for fabricating a photovoltaic device includes forming a metal adhesion layer on a substrate; forming a first transparent conductor layer on the adhesion layer; applying thermal release tape to the first transparent conductor layer; mechanically peeling the thermal release tape to remove the substrate at a weakest interface between the adhesion layer and the substrate; forming a sensitive material on a second transparent conductor layer; and bonding the adhesion layer to the sensitive material to form a photovoltaic device such that the sensitive material avoids exposure to formation processes of the adhesion layer and the first transparent conductor layer.

A photovoltaic device includes an adhesion layer and a first transparent conductor layer formed on the adhesion layer. An organic photovoltaic material is formed on a second transparent conductor layer. The organic photovoltaic material is bonded to the adhesion layer during a transfer process such that the sensitive material avoids exposure to formation processes of the adhesion layer and the first transparent conductor layer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
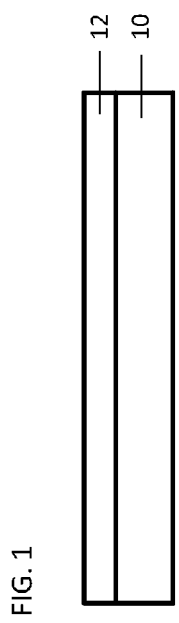
FIG. 1 is a cross-sectional view showing a weak adhesion layer formed on a substrate in accordance with the present principles.

In accordance with the present principles, a transfer process and devices made by such processes are provided. The transfer process includes usage of a weak adhesion layer or layers on a wafer. Materials are deposited on the weak adhesion layer and may be formed into device structures or the like. A removable handle substrate or tape may be applied over the deposited materials and employed to split off the wafer at the weak adhesion layer. The weak adhesion layer is now exposed and is employed to adhere to a target substrate. The handle substrate may then be removed.

In one embodiment, the adhesion layer may include a ductile metal such as gold or silver, and the materials deposited on the weak adhesion layer may include a transparent conductive oxide (TCO), such as zinc oxide (ZnO), indium tin oxide (ITO), etc. The target substrate may include a partially fabricated photovoltaic device. The TCO material may be transferred to the photovoltaic device to form an electrode of the device.

By employing the transfer process (soft process) in accordance with the present principles, the deposited material is formed or assembled without significant heating and/or with an extreme deposition environment that would otherwise negatively impact existing layers on a target structure or device to be manufactured. This opens up many more options for target substrates and materials that can be employed for target layers. Less damage would occur to the target layers. Multiple structures, stacking structures and complicated layers can be manufactured without damaging the target layer or structures/devices on which the transferred materials are formed. This also prevents chemical or other interactions due to high energy processes normally employed to form the deposited materials.

It is to be understood that the present invention will be described in terms of a given illustrative architecture having wafers, substrates and/or photovoltaic stacks; however, other architectures, structures, substrates, materials, process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a photovoltaic device may be created for integrated circuit integration or may be combined with components on a printed circuit board. The circuit/board may be embodied in a graphical computer programming language, and stored in a computer storage medium (such as a disk, tape, physical hard drive, or virtual hard drive such as in a storage access network). If the designer does not fabricate chips or the photolithographic masks used to fabricate chips or photovoltaic devices, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of photovoltaic devices and/or integrated circuit chips with photovoltaic devices. The resulting devices/chips can be distributed by the fabricator in raw wafer form (that is, as a single wafer that has multiple unpackaged devices/chips), as a bare die, or in a packaged form. In the latter case the device/chip is mounted in a single chip package (such as a plastic carrier, with leads that are affixed to a motherboard or other higher level carrier) or in a multichip package (such as a ceramic carrier that has either or both surface interconnections or buried interconnections). In any case, the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor. The photovoltaic devices described herein are particularly useful for solar cells or panels employed to provide power to electronic devices, homes, buildings, vehicles, etc.

It should also be understood that material compounds will be described in terms of listed elements, e.g., GaInP, InGaAs or SiGe. These compounds include different proportions of the elements within the compound, e.g., InGaAs includes $In_x$, $Ga_yAs_{1-x-y}$, where x, y are less than or equal to 1, or SiGe includes $Si_xGe_{1-x}$ where x is less than or equal to 1, etc. In addition, other elements may be included in the compound, such as, e.g., AlInGaAs, and still function in accordance with the present principles. The compounds with additional elements will be referred to herein as alloys.

The present embodiments may be part of a photovoltaic device or circuit, and the circuits as described herein may be part of a design for an integrated circuit chip, a solar cell, a light sensitive device, etc. The photovoltaic device may be a large scale device on the order of feet or meters in length and/or width, or may be a small scale device for use in calculators, solar powered lights, etc. It is also to be understood that the present invention may include tandem (multi-junction) structures.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a substrate or wafer 10 is provided on which a weak adhesion layer 12 is deposited. The substrate 10 may include any suitable substrate material and preferably includes monocrystalline Si, although other substrate materials such as III-V materials (e.g., GaAs, GaN, GaP, InP, etc.), Ge, SiGe, SiC, ceramics, plastics, glass, or other smooth materials with low adhesive properties with the weak adhesion layer 12.

The weak adhesion layer 12 includes a lowest adhesion energy of a stack of materials that will be formed on the weak adhesion layer 12. The weak adhesion layer 12 may include a metal, such as gold, silver, copper, and metals of light and heavy platinum metal triad of elements (e.g., light: ruthenium, rhodium, palladium; heavy: osmium, iridium, platinum), graphene, carbon nanotubes, etc. In a particularly useful embodiment, weak adhesion layer 12 includes gold having a thickness of between 5 nm and 20 nm, and more preferably about 10 nm.

The weak adhesion layer materials provide poor adhesion with the substrate 10 and are thermally stable for a transferring temperature between 80 to 120° C. and preferably around 100° C. Notes that other temperatures may be employed, but lower temperatures are preferred.

Figure 2:
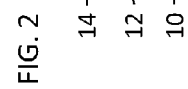
FIG. 2 is a cross-sectional view showing a material layer formed on the weak adhesion layer in accordance with the present principles.

Referring to FIG. 2, a material layer 14 is deposited over the weak adhesion layer 12. The material layer 14 may include any material useful for the formation of a photovoltaic device. The material layer 14 may include a layer patterned for the formation of device structures, may include an active layer employed in the overall device structure and/or may include a transparent conductor (TC) including, e.g., a transparent conductive oxide (TCO), etc. In a particularly useful embodiment, the material layer 14 includes a TC deposited on top of the weak adhesion layer 12 by a sputtering process, although other processes may be employed, e.g., chemical vapor deposition, etc. The transparent conductor may include tin oxide, zinc oxide, titanium oxide, aluminum-doped zinc oxide, indium doped zinc oxide, fluorine doped tin oxide, tin doped indium oxide, antimony doped tin oxide, indium tin oxide, etc. In addition, a composite metal oxide film with or without carbon nanotubes, graphene, metallic nanowires or a metallic grid may also be formed on the material layer 14.

Material layer 14 may include a multilayer structure or device structure on top of the weak adhesion layer 12 or may include a TC layer with one or more additional layers formed thereon. The TC materials employed for layer 14 should have good conductivity, good light transmission, and be thermally stable for a transferring temperature around 100° C. (e.g., 80-120° C.).

Figure 3:
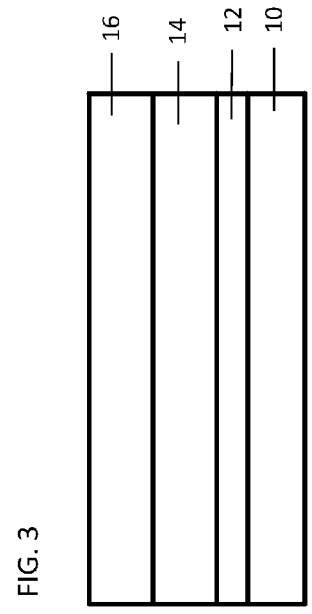
FIG. 3 is a cross-sectional view showing a thermal release tape applied to the material layer in accordance with the present principles.

Referring to FIG. 3, a thermal release tape 16 or a handle substrate is applied on top of the material layer 14. The thermal release tape 16 is an adhesive tape that adheres securely at room temperature, but can be peeled off easy by the application of heat.

Figure 4:
FIG. 4 is a cross-sectional view showing the thermal release tape being peeled to delaminate the weak adhesion layer in accordance with the present principles.

Referring to FIG. 4, the thermal release tape 16 is mechanically peeled off to split the whole structure to remove the substrate or wafer 10. The split occurs at the weak adhesion layer 12. The weak adhesion layer 12 is now exposed and can be further processed. For example, the weak adhesion layer 12 may be etched, textured, patterned, etc. In one embodiment, if the weak adhesion layer 12 includes gold, a gold etchant is optionally employed to clean the surface or even to remove the gold completely.

Figure 5:
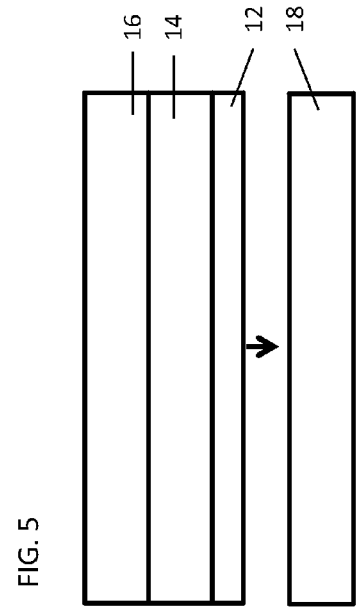
FIG. 5 is a cross-sectional view showing the weak adhesion layer bonding to a sensitive material layer on a target substrate in accordance with the present principles.

Referring to FIG. 5, the layers 12, 14 and 16 are transferred to a target substrate 18. The target substrate 18 may include any layer or layers of material that are sensitive to conventional processing, e.g., sensitive to high temperatures, ion bombardment, etc. By transferring the layers 12, 14 and 16 to the target substrate 18 (sensitive layer), the target substrate 18 is not subjected to the processing of these layers 12, 14, and 16. In a particularly useful embodiment, the target substrate 18 includes organic photovoltaic materials; however, other materials, e.g., inorganic materials (amorphous silicon, etc.) may be employed.

The weak adhesion layer 12 is brought into contact with the target substrate 18 and adhered thereto. The adherence may be achieved through pressure, heat, chemical reaction, adhesive bonding, cold welding, etc. depending on the materials and the application.

Figure 6:
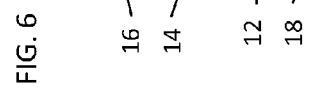
FIG. 6 is a cross-sectional view showing the thermal release tape removed in accordance with the present principles.

Referring to FIG. 6, the thermal release tape 16 is removed by heating the tape 16 to its release temperature, e.g., 100° C., to release the tape 16. This leaves the weak adhesion layer 12 and the material layer 14 on the target substrate 18. It should be understood that the sensitive materials of the target substrate 18 are not subjected to temperatures above 120 degrees C. and more preferably are not subjected to temperatures above 100 degrees C.

Figure 7:
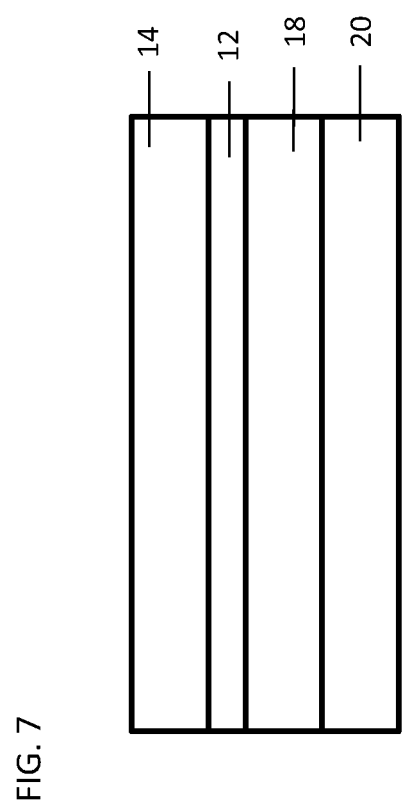
FIG. 7 is a cross-sectional view showing a photovoltaic device having an organic photovoltaic layer and a second transparent conductor in accordance with the present principles.

It should be further understood that the target substrate 18 may include a multilayered structure. For example, organic photovoltaic materials may be formed on a transparent conductor 20 or other layer or layers, as shown in FIG. 7. Since the transparent conductor 20 is formed first, the sensitive material of the target substrate 18 is not subjected to its processing. The transparent conductor 20 may include indium tin oxide, or other transparent materials as described. In addition, organic transparent conductors may be employed, such as e.g., PEDOT:PSS or poly(3,4-ethylenedioxythiophene)poly(styrenesulfonate). PEDOT:PSS is a polymer mixture of two ionomers. One component in this mixture is made up of sodium polystyrene sulfonate which is a sulfonated polystyrene. Part of the sulfonyl groups are deprotonated and carry a negative charge. The other component poly(3,4-ethylenedioxythiophene) or PEDOT is a conjugated polymer and carries positive charge and is based on polythiophene. Together the charged macromolecules form a macromolecular salt., which is used as a transparent, conductive polymer with high ductility. Other materials are also contemplated.

It should be understood that different kinds of processing methods may be employed to provide layers on the weak adhesion layer 12. These layers may then be transferred to a sensitive film or other kind of film. Tandem/stacking device structures can be made by single transferring or multiple transferring. Combinations of the template (Si wafer) and weak adhesion layer may include different materials. Further, modified layers can be applied after transferring the film to incorporate different functions. Different functions of the transferred layer (14) and weak adhesion layer (12) can be adjusted depending on different applications.

Figure 8:
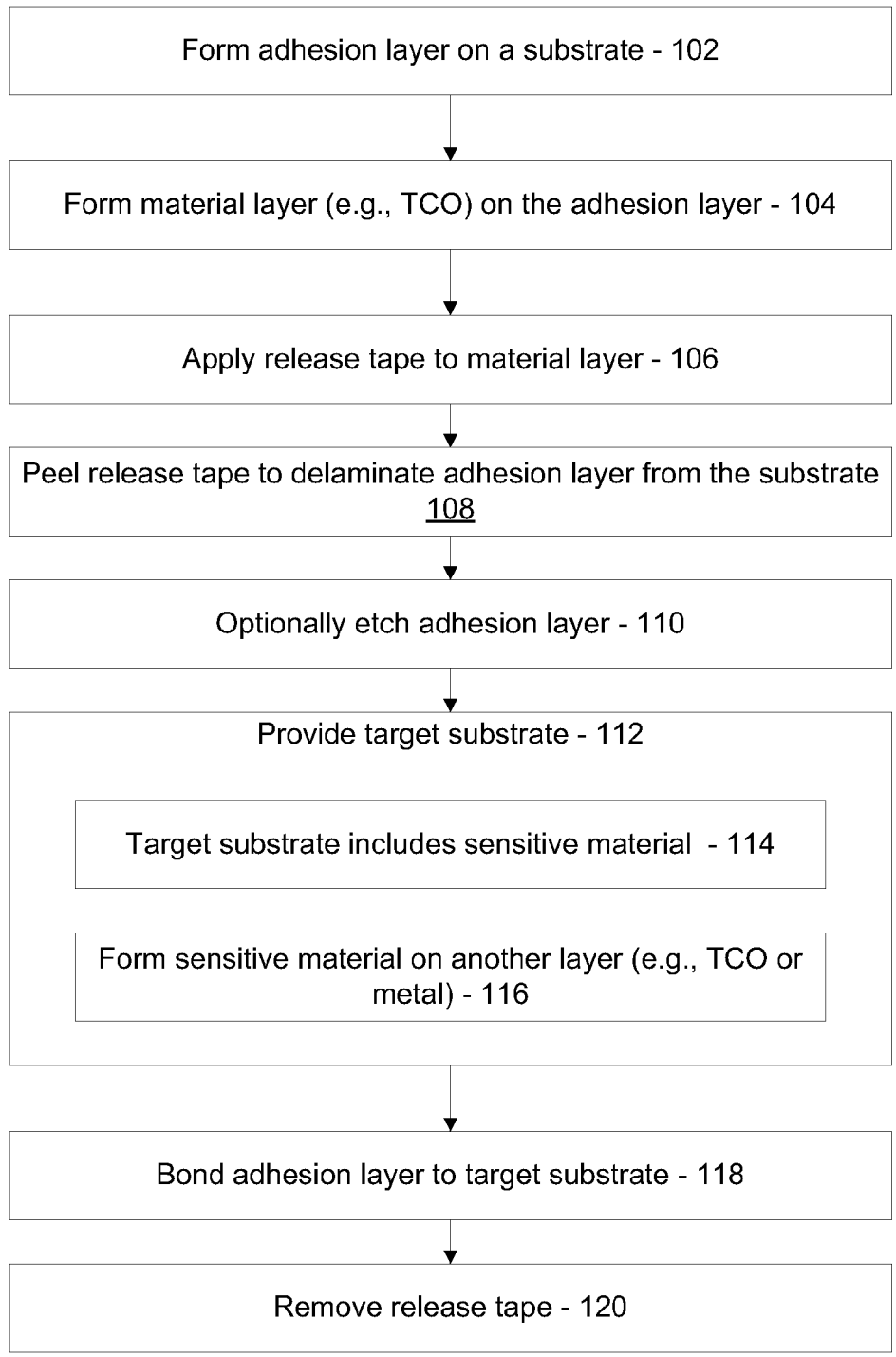
FIG. 8 is a block/flow diagram showing the fabrication of a photovoltaic device in accordance with illustrative embodiments.

Referring to FIG. 8, a method for fabricating a photovoltaic device is shown in accordance with illustrative embodiments. It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 102, an adhesion layer is formed on a substrate. The adhesion layer may include one or more of: gold, silver, copper and platinum, graphene, carbon nanotubes, etc. The adhesion layer is provided such that the interface between the substrate and the adhesion layer is designed to delaminate first during a subsequent peeling process. In block 104, a material layer is formed on the adhesion layer. In one embodiment, the material layer includes a first transparent conductor layer, although other structures and multi-layered structures are contemplated instead of the transparent conductor or in addition to the transparent conductor (e.g., a metal grid).

In block 106, a release tape, such as a thermal release tape, is applied to the material layer (e.g., first transparent conductor layer). In block 108, the thermal release tape is mechanically peeled to remove the substrate at a weakest interface between the adhesion layer and the substrate. In block 110, the adhesion layer may optionally be etched prior to bonding to reduce its thickness. The reduction in thickness may be employed to permit better light transmission through the adhesion layer. The adhesion layer may be removed depending on process requirements. The adhesion layer may partially block light transmission and to have better transmission properties, etching the adhesion layer is preferred.

In block 112, a target substrate is provided. In block 114, the target substrate includes a sensitive material, such as e.g., an organic photovoltaic material. Organic photovoltaic materials may include, e.g., poly(3-hexylthiophene) (P3HT), [6,6]-phenyl C61-butyric acid methyl ester ($PC_{60}BM$), poly(phenylene)vinylene (PPV), cyano-poly(phenylene)vinylene (CN-PPV), poly[2-methoxy-5-(2'-ethylhexyloxy)-p-phenylene vinylene] (MEH-PPV), phthalocyanine, polyacetylene, etc. In one embodiment, the sensitive material is formed on another layer or substrate. The other layer or substrate may include a second transparent conductor layer, a metal layer, etc., in block 116. In block 118, the adhesion layer is bonded to the target substrate (e.g., sensitive material) to form a photovoltaic device. The sensitive material avoids exposure to formation processes of the adhesion layer and the first transparent conductor layer. The bonding may include one or more of applying pressure, applying adhesive, chemically bonding the adhesion layer to the sensitive material, etc.

By employing the transfer process, the sensitive material is not exposed to harsh processing conditions. In particularly useful embodiments, the sensitive material is not exposed to temperatures above 120 degrees Celsius, and more preferably not exposed to temperatures above 100 degrees Celsius. In block 120, the thermal release tape is removed using heat, e.g., less than about 100 degrees Celsius.

Having described preferred embodiments for a transferable transparent conductive oxide (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:
1. A photovoltaic device, comprising:
an adhesion layer;
a first transparent conductor layer formed on the adhesion layer;
an organic photovoltaic material formed on a second transparent conductor layer; and
the organic photovoltaic material being bonded to the adhesion layer during a transfer process such that the organic photovoltaic material remains undamaged by formation processes of the adhesion layer and the first and second transparent conductor layers.

2. The device as recited in claim 1, wherein the adhesion layer includes a layer of one or more of: gold, silver, copper, platinum, graphene and carbon nanotubes.

3. The device as recited in claim 1, further includes a metal grid formed on the first transparent conductor.

4. The device as recited in claim 1, wherein the organic photovoltaic material is exposed to temperatures not exceeding 120 degrees Celsius.

5. The device as recited in claim 1, wherein the adhesion layer includes a thickness of 20 nm or less.

6. The device as recited in claim 1, wherein the organic photovoltaic material is disposed adjacent to the adhesion layer with no intervening elements disposed therein.

7. The device as recited in claim 1, further includes a metal oxide film formed on the first transparent conductor.

8. The device as recited in claim 1, further includes carbon nanotubes, graphene or metallic nanowires on the first transparent conductor.

9. The device as recited in claim 1, wherein the first and/or second transparent conductor includes at least one of PEDOT:PSS or poly(3,4-ethylenedioxythiophene) poly(styrenesulfonate).

10. The device as recited in claim 1, wherein the organic photovoltaic material includes at least one of poly(3-hexylthiophene) (P3HT), [6,6]-phenyl C61 -butyric acid methyl ester ($PC_{60}BM$), poly(phenylene) vinylene (PPV), cyano-poly(phenylene) vinylene (CN-PPV), poly[2-methoxy-5-(2'-ethylhexyloxy)-p-phenylene vinylene] (MEH-PPV), phthalocyanine, or polyacetylene.

\* \* \* \* \*